(12) United States Patent
Zan et al.

(10) Patent No.: US 11,226,400 B2
(45) Date of Patent: Jan. 18, 2022

(54) PROXIMITY SENSOR AND OPERATION METHOD THEREOF

(71) Applicant: E Ink Holdings Inc., Hsinchu (TW)

(72) Inventors: Hsiao-Wen Zan, Hsinchu (TW); Chuang-Chuang Tsai, Hsinchu (TW); Ching-Fu Lin, Hsinchu (TW); Chao-Hsuan Chen, Hsinchu (TW); Zong-Xuan Li, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 159 days.

(21) Appl. No.: 16/824,681

(22) Filed: Mar. 19, 2020

(65) Prior Publication Data
US 2020/0300976 A1 Sep. 24, 2020

(30) Foreign Application Priority Data
Mar. 21, 2019 (TW) ................................ 108109845

(51) Int. Cl.
| | | |
|---|---|---|
| *G01B 11/14* | (2006.01) | |
| *G01S 7/481* | (2006.01) | |
| *G01S 17/08* | (2006.01) | |
| *G01J 1/42* | (2006.01) | |
| *G01J 1/02* | (2006.01) | |

(52) U.S. Cl.
CPC ............ *G01S 7/4811* (2013.01); *G01J 1/0204* (2013.01); *G01J 1/42* (2013.01); *G01S 17/08* (2013.01)

(58) Field of Classification Search
CPC ..... G01B 11/026; G01B 11/002; G01B 11/14; G01S 5/163; G01S 5/16

USPC .......................................................... 356/614
See application file for complete search history.

(56) References Cited

U.S. PATENT DOCUMENTS

| | | |
|---|---|---|
| 8,624,585 B2 | 1/2014 | Mizusaki et al. |
| 9,001,087 B2 | 4/2015 | Eriksson et al. |
| 9,088,282 B2 | 7/2015 | Holenarsipur et al. |
| 9,535,157 B2 | 1/2017 | Caley et al. |

(Continued)

FOREIGN PATENT DOCUMENTS

| | | |
|---|---|---|
| CN | 102043272 A | 5/2011 |
| CN | 206946506 U | 1/2018 |

(Continued)

OTHER PUBLICATIONS

Corresponding Taiwan office action dated Dec. 19, 2019.

*Primary Examiner* — Md M Rahman
(74) *Attorney, Agent, or Firm* — CKC & Partners Co., LLC (57) ABSTRACT

A proximity sensor includes a substrate, a light source, a finger electrode, an active layer, and a transparent electrode layer. The substrate has opposite top and bottom surfaces. The light source faces toward the bottom surface of the substrate. The finger electrode is located on the top surface of the substrate, and has finger portions and gaps between every two adjacent finger portions. The active layer covers the finger electrode, and is located in the gaps. The transparent electrode layer is located on the active layer. When the light source emits light, the light through the gaps sequentially passes through the active layer and the transparent electrode layer onto a reflective surface. The light is reflected by the reflective surface to form reflected light, and the reflected light passes through the transparent electrode layer and is received by the active layer.

16 Claims, 12 Drawing Sheets

(56) References Cited

U.S. PATENT DOCUMENTS

| | | | |
|---|---|---|---|
| 9,641,172 B2 | 5/2017 | Salter | |
| 9,778,076 B2 | 10/2017 | Lee et al. | |
| 2011/0193818 A1 | 8/2011 | Chen et al. | |
| 2015/0108520 A1* | 4/2015 | Kim | H01L 33/38 257/98 |

FOREIGN PATENT DOCUMENTS

| | | |
|---|---|---|
| CN | 208093578 U | 11/2018 |
| WO | 2017043706 A1 | 3/2017 |
| WO | 2018012248 A1 | 1/2018 |

* cited by examiner

PROXIMITY SENSOR AND OPERATION METHOD THEREOF

RELATED APPLICATIONS

This application claims priority to Taiwan Application Serial Number 108109845, filed Mar. 21, 2019, which is herein incorporated by reference.

BACKGROUND

Field of Invention

The present invention relates to a proximity sensor and an operation method of the proximity sensor.

Description of Related Art

A traditional proximity sensor is generally designed to have a light source and a sensor spaced apart from the light source. Therefore, when light emitted by the light source is reflected by a reflective surface to form reflected light, most of the reflected light cannot be received by the sensor located next to the light source, and thus the utilization efficiency of the reflected light is difficult to be improved. As a result, an obvious distance change between the reflective surface and the proximity sensor is required to enable a photocurrent value obtained by the sensor to have an obvious change, and the resolution of proximal sensing is poor.

In addition, for unknown types of reflective surfaces, the reflective surfaces associated with the light source may have different reflectivity due to different types (materials) of the reflective surfaces, and methods of determining the distance may also be different. A conventional proximity sensor is difficult to measure distances to the respective types of reflective surfaces, and thus cannot be used in an application requiring precise proximal sensing, such as an application in which robot fingers clamp an egg without breaking the egg.

SUMMARY

An aspect of the present invention is to provide a proximity sensor.

According to an embodiment of the present invention, a proximity sensor includes a first substrate, a first light source, a first finger electrode, a first active layer, and a first transparent electrode layer. The first substrate has a top surface and a bottom surface opposite the top surface. The first light source faces toward the bottom surface of the first substrate. The first finger electrode is located on the top surface of the first substrate, and has first finger portions and first gaps between every two adjacent ones of the first finger portions. The first active layer covers the first finger electrode and is located in the first gaps. The first transparent electrode layer is located on the first active layer. When the first light source emits first light, the first light through the first gaps sequentially passes through the first active layer and the first transparent electrode layer onto a reflective surface, and the first light is reflected by the reflective surface to form first reflected light, and the first reflected light passes through the first transparent electrode layer and is received by the first active layer.

In one embodiment of the present invention, the first active layer overlaps with the first light source.

In one embodiment of the present invention, the first finger electrode is opaque.

In one embodiment of the present invention, the first transparent electrode layer is made of a material including silver and aluminum.

In one embodiment of the present invention, the proximity sensor further includes a second substrate, a second light source, a second finger, a second active layer, and a second transparent electrode layer. The second substrate is spaced apart from the first substrate, and has a top surface and a bottom surface opposite the top surface. The second light source faces toward the bottom surface of the second substrate. The second finger electrode is located on the top surface of the second substrate, and has second finger portions and a plurality of second gaps between the second finger portions. The second active layer covers the second finger electrode and is located in the second gaps. The second transparent electrode layer is located on the second active layer. When the second light source emits second light, the second light through the second gaps sequentially passes through the second active layer and the second transparent electrode layer onto the reflective surface, and the second light is reflected by the reflective surface to form second reflected light, and the second reflected light passes through the second transparent electrode layer and is received by the second active layer.

In one embodiment of the present invention, the second transparent electrode layer is located closer to the reflective surface than the first transparent electrode layer is.

In one embodiment of the present invention, the second active layer is located closer to the reflective surface than the first active layer is.

In one embodiment of the present invention, a luminous intensity of the first light source is substantially the same as that of the second light source, and a height difference is formed between the first transparent electrode layer and the second transparent electrode layer.

In one embodiment of the present invention, the second active layer overlaps with the second light source.

In one embodiment of the present invention, the second finger electrode is opaque.

In one embodiment of the present invention, the second transparent electrode layer is made of a material including silver and aluminum.

Another aspect of the present invention is to provide an operation method of a proximity sensor.

According to an embodiment of the present invention, an operation method of a proximity sensor includes using a first light source facing toward a bottom surface of a first substrate to emit first light such that the first light through first gaps of a first finger electrode sequentially passes through a first active layer that covers the first finger electrode and a first transparent electrode layer that is on the first active layer; using a reflective surface to reflect the first light to form first reflected light; and using the first active layer to receive the first reflected light that passes through the first transparent electrode layer, thereby obtaining a first photocurrent value.

In one embodiment of the present invention, the operation method further includes looking up a relationship between photocurrent and luminous intensity based on the first photocurrent value to obtain a distance between the reflective surface and the first active layer.

In one embodiment of the present invention, the operation method further includes using a second light source facing toward a bottom surface of a second substrate to emit second light such that the second light through second gaps of a second finger electrode sequentially passes through a second active layer that covers the second finger electrode and a second transparent electrode layer that is on the second active layer, in which a luminous intensity of the first light source is substantially the same as that of the second light source, and the second active layer is located closer to the reflective surface than the first active layer is; using a reflective surface to reflect the second light to form a second reflected light; and using the second active layer to receive the second reflected light that passes through the second transparent electrode layer, thereby obtaining a second photocurrent value.

In one embodiment of the present invention, the operation method further includes changing a distance between the reflective surface and the proximity sensor to obtain a distance difference; respectively using the first light source and the second light source to emit third light and fourth light; respectively using the first active layer and the second active layer to receive third reflected light that passes through the first transparent electrode layer and fourth reflected light that passes through the second transparent electrode layer, thereby obtaining a third photocurrent value and a fourth photocurrent value; and determining a type of the reflective surface based on a first difference between the first photocurrent value and the second photocurrent value, a second difference between the third photocurrent value and the fourth photocurrent value, and the distance difference.

In one embodiment of the present invention, a height difference is formed between the first transparent electrode layer and the second transparent electrode layer, and the operation method further includes determining a type of the reflective surface based on a difference between the first photocurrent value and the second photocurrent value and the height difference.

In the aforementioned embodiments of the present invention, since the first light source of the proximity sensor faces toward the bottom surface of the first substrate, and the first active layer covers the first finger electrode and is located in the first gaps of the first finger electrode, the first light through the first gaps may pass through the first active layer and the first transparent electrode layer onto the reflective surface when the first light source emits the first light. Thereafter, the first light may be reflected by the reflective surface to form the first reflected light, and the first reflected light may pass through the first transparent electrode layer and is received by the first active layer. Because the first light source is located below the first substrate, such a configuration can significantly increase the utilization efficiency of the reflected light during proximal sensing. As a result, only a small change of the distance from the reflective surface is required to enable a photocurrent value to be measured by the proximity sensor to form an obvious change, thereby effectively improving the resolution of proximal sensing.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
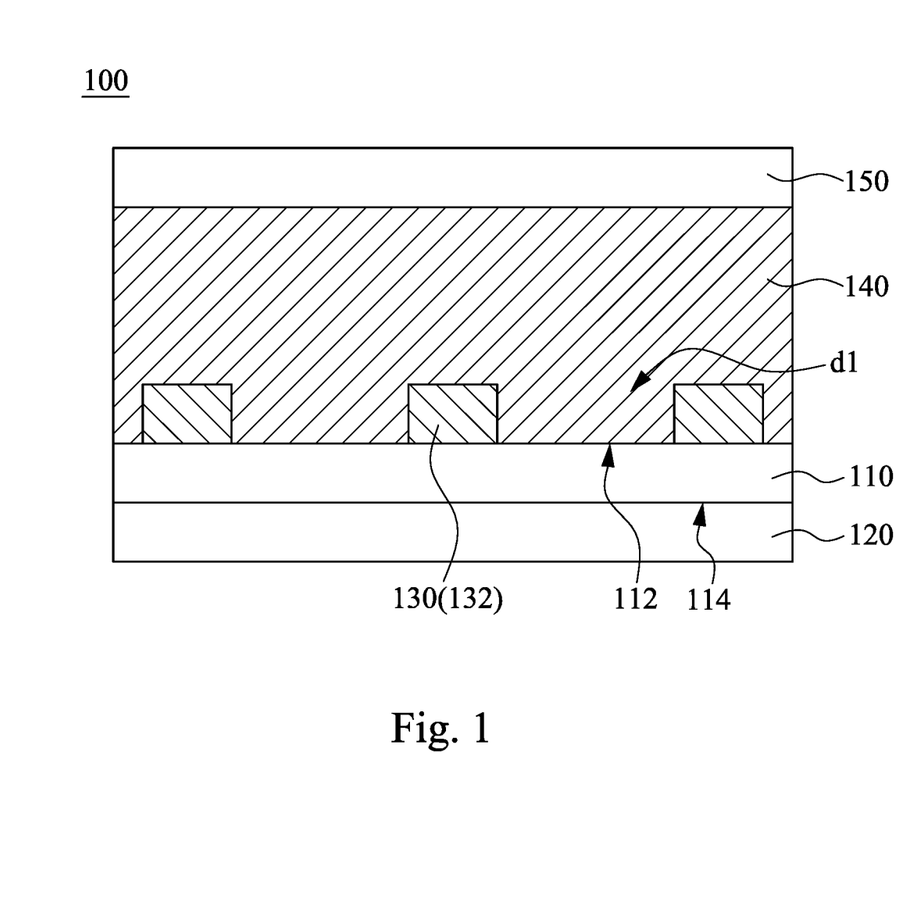
FIG. 1 is a cross-sectional view of a proximity sensor according to one embodiment of the present invention.
Figure 2:
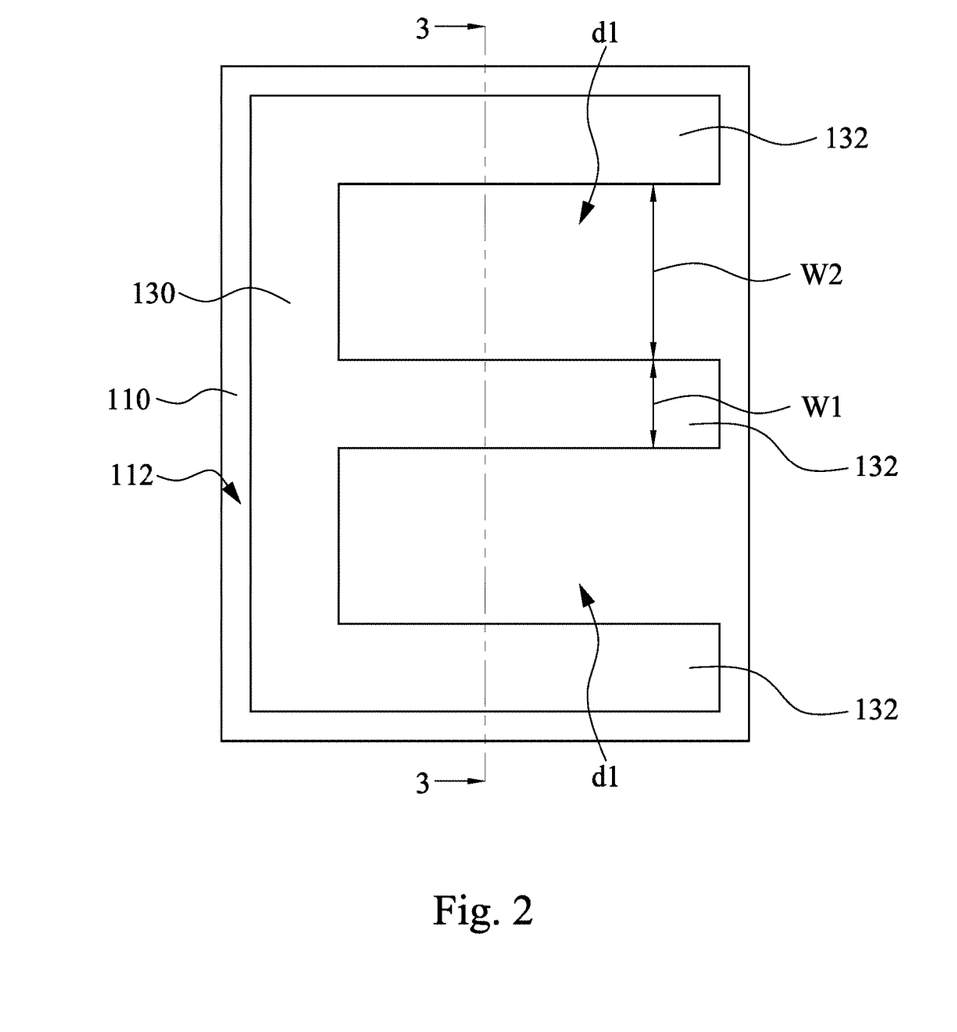
FIG. 2 is a top view of a first finger electrode formed on a first substrate according to one embodiment of the present invention.

FIG. 1 is a cross-sectional view of a proximity sensor 100 according to one embodiment of the present invention. FIG. 2 is a top view of a first finger electrode 130 formed on a first substrate 110 according to one embodiment of the present invention. As shown in FIG. 1 and FIG. 2, the proximity sensor 100 includes the first substrate 110, a first light source 120, the first finger electrode 130, a first active layer 140, and a first transparent electrode layer 150. The first substrate 110 has a top surface 112 and a bottom surface 114 opposite the top surface 112. The first light source 120 faces toward the bottom surface 114 of the first substrate 110. In this embodiment, the first light source 120 is disposed on the bottom surface 114 of the first substrate 110. The first finger electrode 130 is located on the top surface 112 of the first substrate 110, and has first finger portions 132 and first gaps d1 between every two adjacent ones of the first finger portions 132. The first gaps d1 may allow light to pass through. The first active layer 140 covers the first finger electrode 130 and is located in the first gaps d1. The first transparent electrode layer 150 is located on the first active layer 140. Moreover, as shown in FIG. 1, the first active layer 140 overlaps with the first light source 120.

In the following paragraphs, a manufacturing method of the proximity sensor 100 will be explained.

Figure 3:
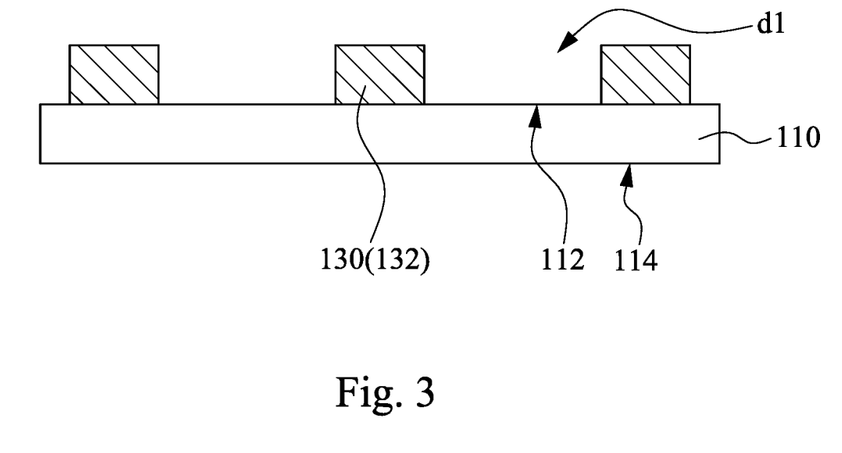
FIGS. 3 to 5 are cross-sectional views of showing a manufacturing method of a proximity sensor at different stages according to one embodiment of the present invention.
Figure 4:
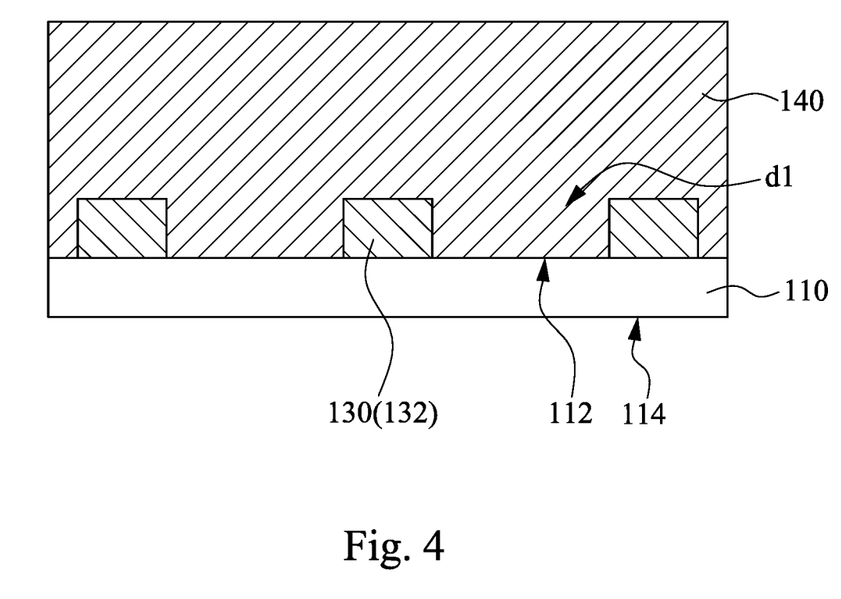
Figure 5:
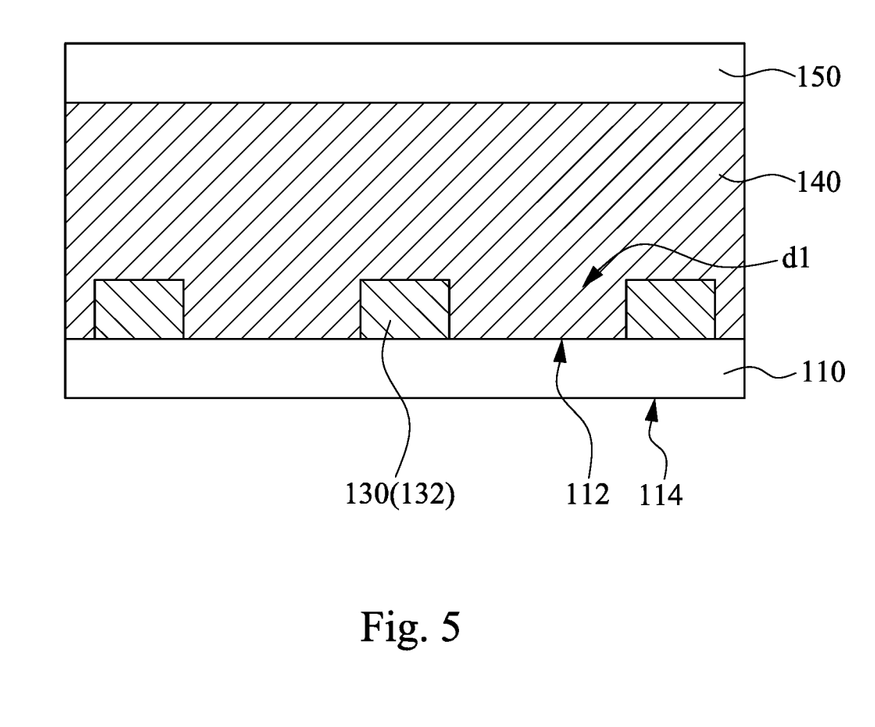

FIG. 2 is a top view of the first finger electrode 130 formed on the first substrate 110 according to one embodiment of the present invention. FIGS. 3 to 5 are cross-sectional views showing a manufacturing method of the proximity sensor 100 at different stages according to one embodiment of the present invention, in which FIG. 3 is a cross-sectional view taken along line 3-3 of FIG. 2. As shown in FIG. 2 and FIG. 3, the first finger portion 132 of the first finger electrode 130 has a width W1, and the first gap d1 has a width W2. In this embodiment, the width W1 is about 50 µm, and the width W2 is about 110 µm, but the present invention is not limited in this regard. In another embodiment, the widths of the first finger portions 132 may be different. In another embodiment, the widths of the first gaps d1 may be different. The first finger electrode 130 may be formed on the first substrate 110 by thermal evaporation, and is an opaque electrode.

As shown in FIG. 4, after the formation of the first finger electrode 130, a material of an active layer having the property of light absorption may be used to cover the first finger electrode 130 by blade coating, such that the material of the active layer fills the first gaps d1, and thus the first active layer 140 is formed.

Next, as shown in FIG. 5, the first transparent electrode layer 150 may be formed on the first active layer 140 by thermal evaporation, and is a light transmissive electrode. In this embodiment, the first transparent electrode layer 150 may be made of a material including silver and aluminum, such as silver having a thickness of 10 nm and aluminum having a thickness of 2 nm, but the present invention is not limited in this regard. After the formation of the first transparent electrode layer 150, the first light source 120 may be disposed on the bottom surface 114 of the first substrate 110, thereby obtaining the proximity sensor 100 of FIG. 1.

It is noted that connection relationships, manufacturing methods, and materials of the elements described above will not be described again in the following description. In the following description, the operation method of the proximity sensor 100 will be described.

Figure 6:
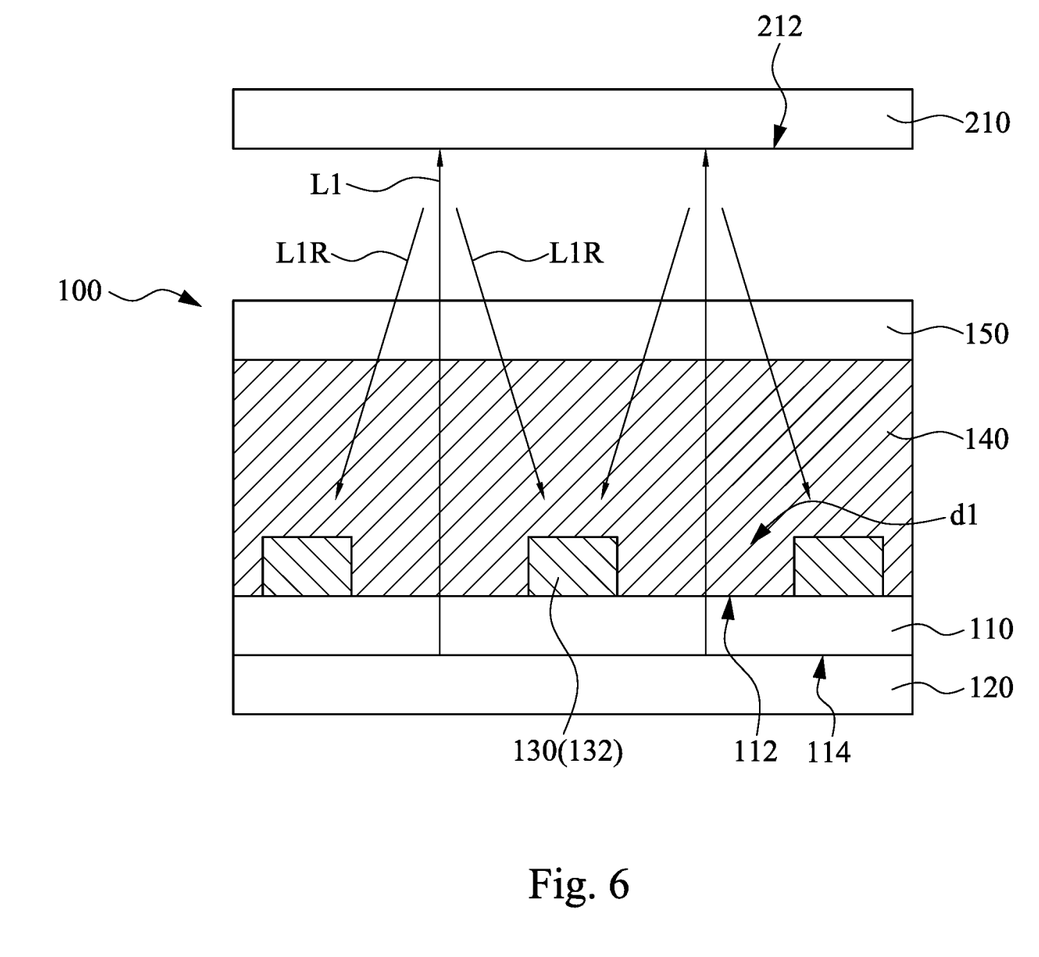
FIG. 6 is a cross-sectional view of the proximity sensor of FIG. 1 in operation.

FIG. 6 is a cross-sectional view of the proximity sensor 100 of FIG. 1 in operation. FIG. 6 shows that the proximity sensor 100 is moved to proximate a reflective surface 212 of a reflective body 210, or the reflective surface 212 of the reflective body 210 is moved to proximate the proximity sensor 100. The operation method of the proximity sensor 100 includes using the first light source 120 to emit first light L1 such that the first light L1 through the first gap d1 of the first finger electrode 130 sequentially passes through the first active layer 140 and the first transparent electrode layer 150. Thereafter, the reflective surface 212 may reflect the first light L1 to form first reflected light L1R. Afterwards, the first active layer 140 may be used to receive the first reflected light L1R that passes through the first transparent electrode layer 150, thereby obtaining a first photocurrent value. As a result, if a distance between reflective surface 212 and the proximity sensor 100 is changed, the first photocurrent value measured by the proximity sensor 100 can be correspondingly changed, such that proximal sensing is achieved.

Because the first light source 120 is located below the first substrate 110, such a configuration can significantly increase the utilization efficiency of the reflected light L1R during proximal sensing. As a result, only a small change of the distance between the reflective surface 212 and the proximity sensor 100 is required to enable the first photocurrent value to be measured by the proximity sensor 100 to form an obvious change, thereby effectively improving the resolution of proximal sensing.

Figure 7:
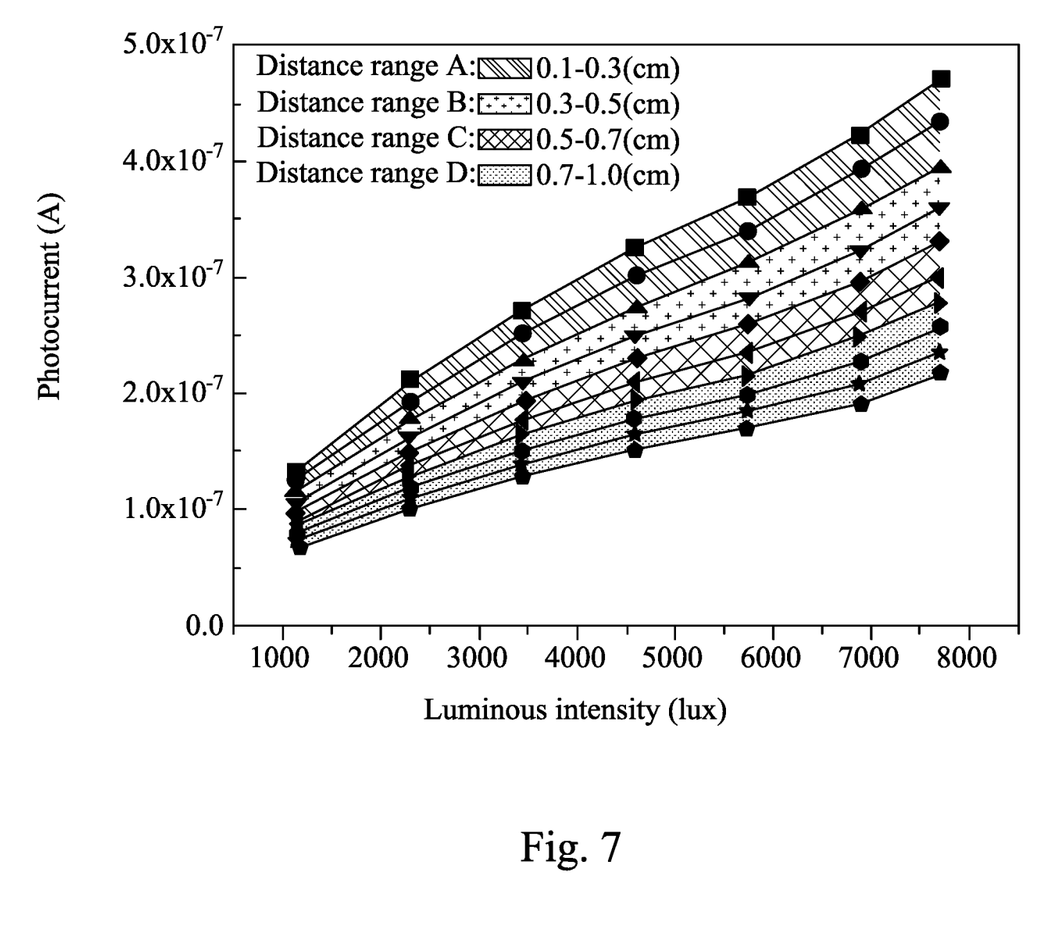
FIG. 7 illustrates photocurrent-luminous intensity relationships of a proximity sensor applied to a known reflective surface with different distance ranges according to one embodiment of the present invention.

FIG. 7 illustrates photocurrent-luminous intensity relationships of the proximity sensor 100 applied to a known reflective surface 212 with different distance ranges A, B, C, and D according to one embodiment of the present invention. As shown in FIG. 6 and FIG. 7, for a known type (e.g., material and reflectivity) of the reflective surface 212, relationships of photocurrent values of the proximity sensor 100 associated with the different distance ranges A, B, C, and D and corresponding variation of luminous intensity may be pre-established. Different distances between the reflective surface 212 and the proximity sensor 100 form a trend of different photocurrent values versus corresponding changes of luminous intensities. Therefore, two light sources with a greater intensity difference therebetween (e.g., 1150 lux and 7700 lux of FIG. 7) and corresponding photocurrent values are utilized to calculate slopes, such that relationships between slopes photocurrents to luminous intensities and distance ranges shown in FIG. 8 may be obtained.

Figure 8:
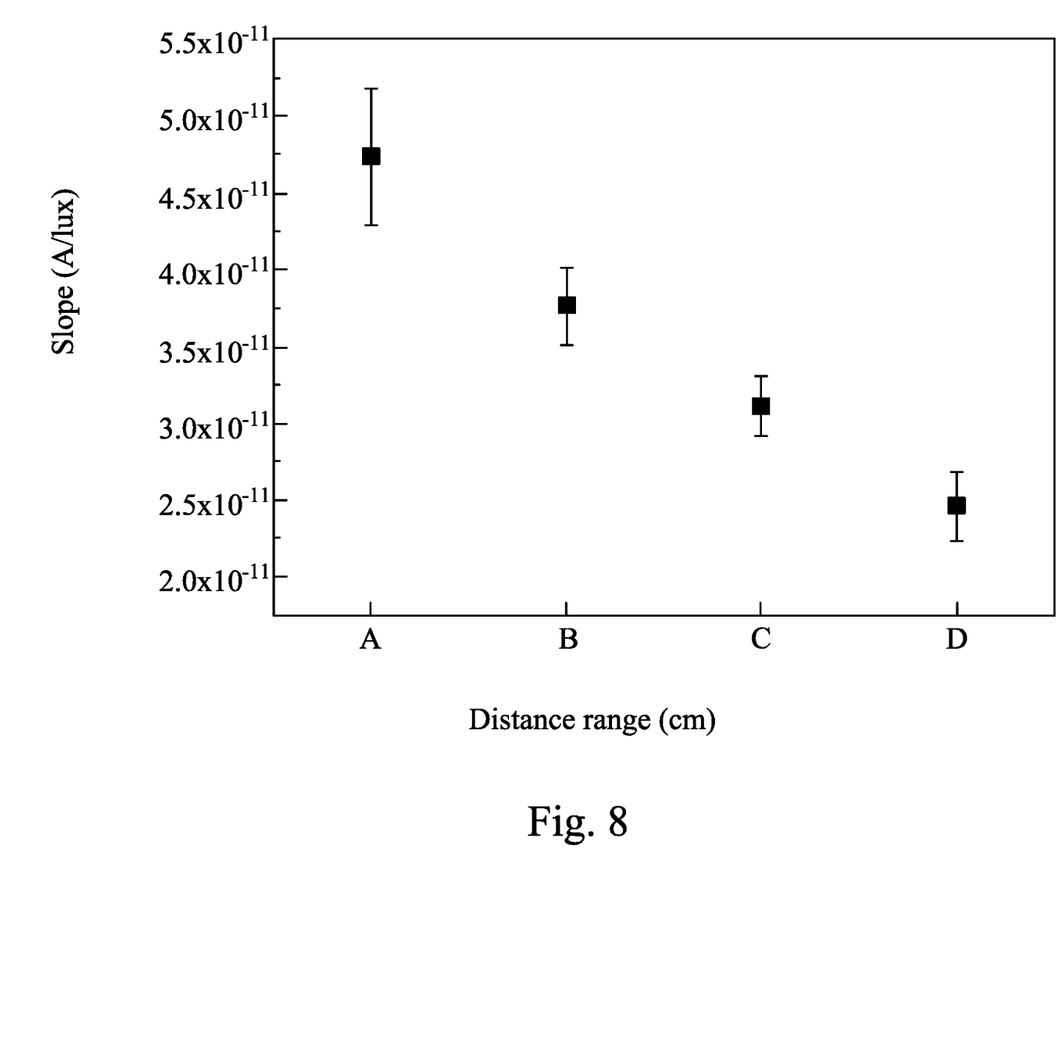
FIG. 8 illustrates relationships between slopes of photocurrents to luminous intensities shown in FIG. 7 and distance ranges.

FIG. 8 illustrates relationships between slopes of photocurrents to luminous intensities shown in FIG. 7 and distance ranges. As shown in FIG. 6 and FIG. 8, when the first active layer 140 receives the first reflected light L1R that passes through the first transparent electrode layer 150 to obtain a first photocurrent value, by looking up the relationship of photocurrent-luminous intensity of FIG. 7 with the first photocurrent value, the distance range A, B, C, or D between the reflective surface 212 and the proximity sensor 100 (e.g., the first active layer 140) can be obtained through different slope ranges of FIG. 8.

Figure 9:
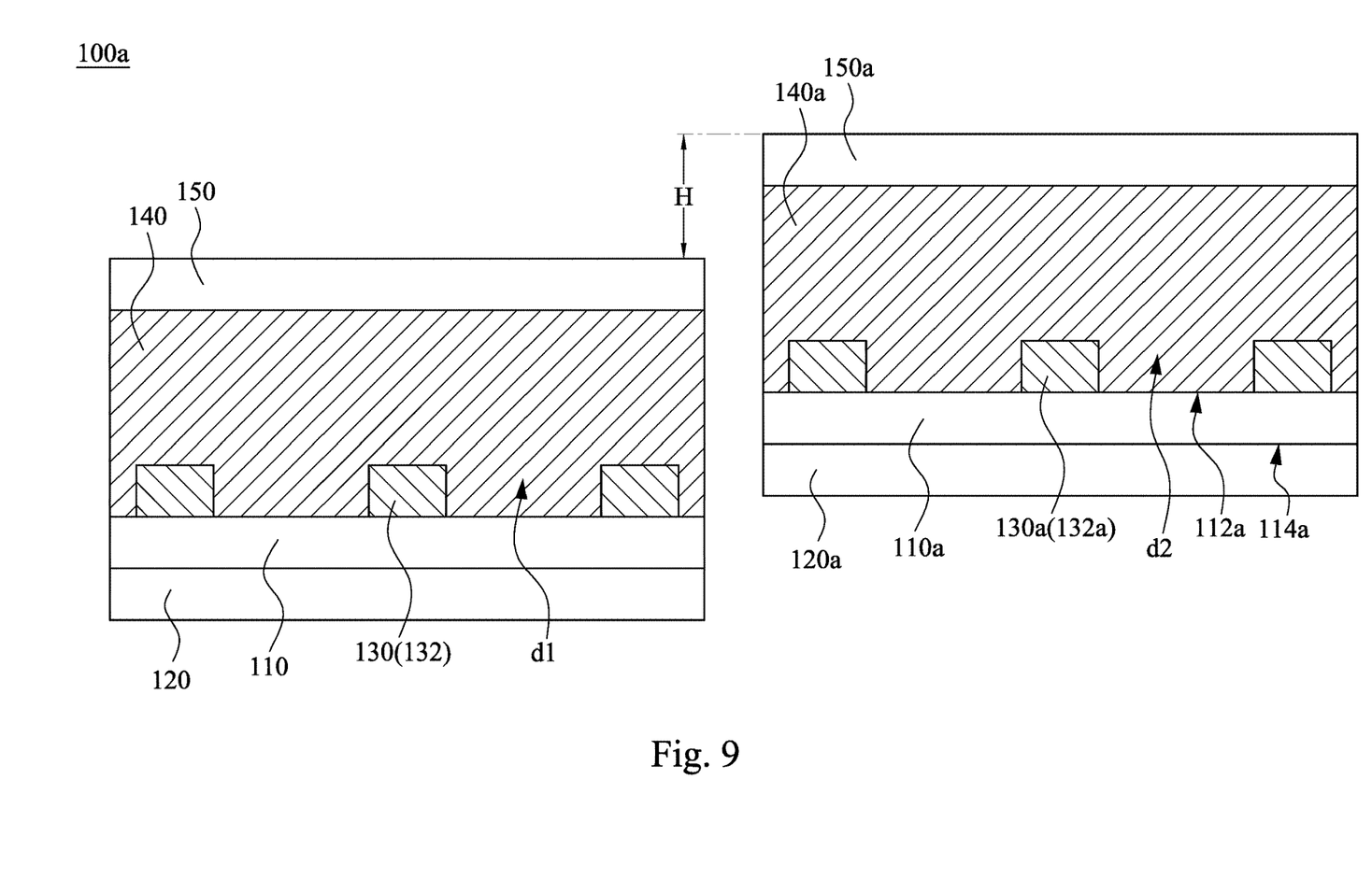
FIG. 9 is a cross-sectional view of a proximity sensor according to another embodiment of the present invention.

FIG. 9 is a cross-sectional view of a proximity sensor 100a according to another embodiment of the present invention. The proximity sensor 100a includes the first substrate 110, the first light source 120, the first finger electrode 130, the first active layer 140, and the first transparent electrode layer 150. The difference between this embodiment and the embodiment shown in FIG. 1 is that the proximity sensor 100a further includes a second substrate 110a, a second light source 120a, a second finger electrode 130a, a second active layer 140a, and a second transparent electrode layer 150a. The second substrate 110a is spaced apart from the first substrate 110, and has a top surface 112a and a bottom surface 114a opposite the top surface 112a. The second light source 120a faces toward the bottom surface 114a of the second substrate 110a. The second finger electrode 130a is located on the top surface 112a of the second substrate 110a. The second finger electrode 130a has a plurality of second finger portions 132a and a plurality of second gaps d2 between the second finger portions 132a. The second active layer 140a covers the second finger electrode 130a and is located in the second gaps d2. The second transparent electrode layer 150a is located on the second active layer 140a. Moreover, as shown in FIG. 9, the second active layer 140a overlaps with the second light source 120a.

In this embodiment, the luminous intensity of the first light source 120 is substantially the same as that of the second light source 120a, and a height difference H is formed between the first transparent electrode layer 150 and the second transparent electrode layer 150a. The second finger electrode 130a is opaque. The second transparent electrode layer 150a is made of a material including silver and aluminum. Furthermore, the manufacturing method of the structure including the second substrate 110a, the second light source 120a, the second finger electrode 130a, the second active layer 140a, and the second transparent electrode layer 150a are similar to that of the structure including the first substrate 110, the first light source 120a, the first finger electrode 130, the first active layer 140, and the first transparent electrode layer 150 (such as the description associated with FIG. 3 to FIG. 5), and will not be described again.

Figure 10:
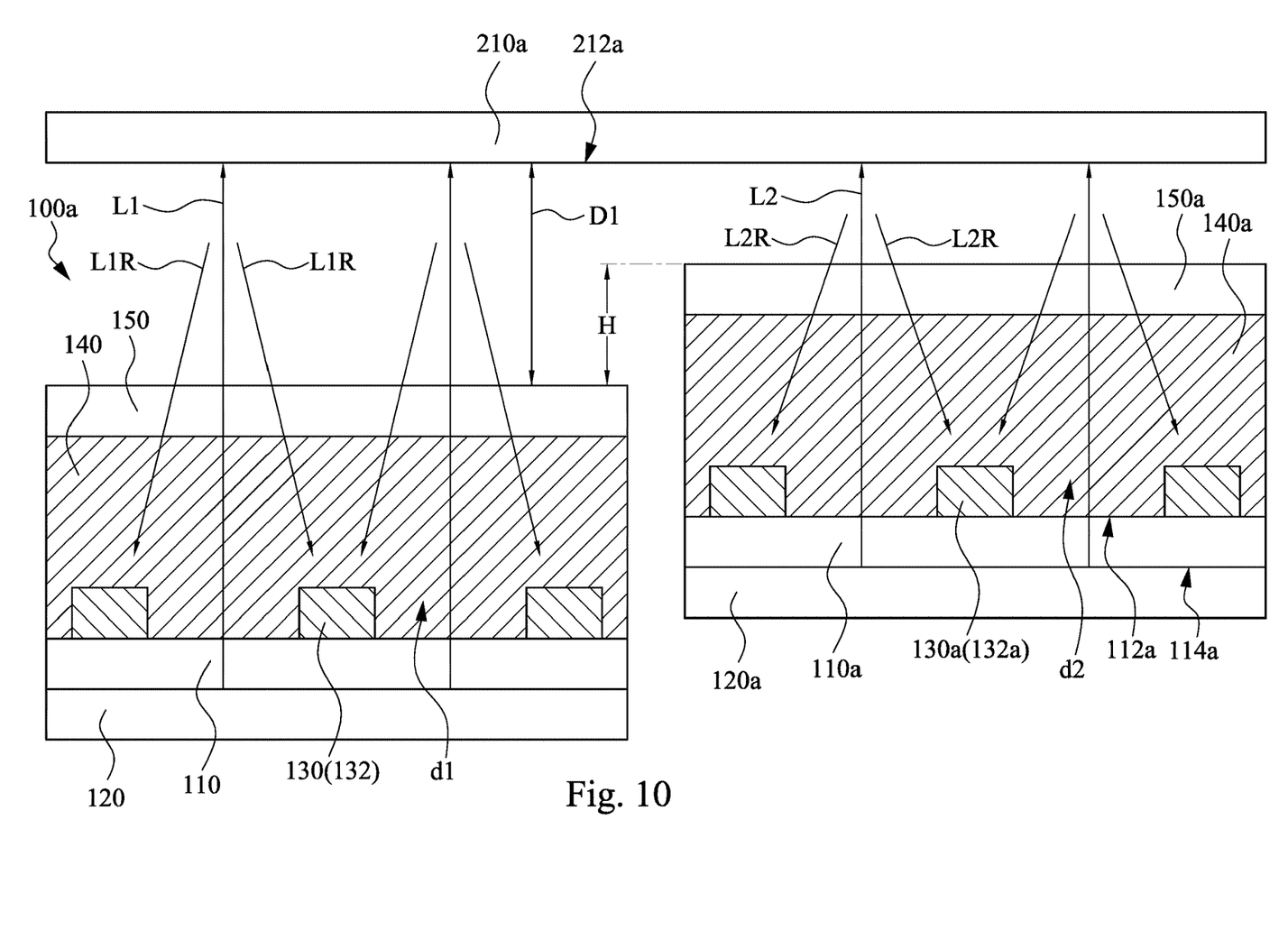
FIG. 10 is a cross-sectional view of the proximity sensor of FIG. 9 in operation.

FIG. 10 is a cross-sectional view of the proximity sensor 100a of FIG. 9 in operation. FIG. 10 shows the proximity sensor 100a is moved to proximate a reflective surface 212a of a reflective body 210a, or the reflective surface 212a of the reflective body 210a is moved to proximate the proximity sensor 100a. The second transparent electrode layer 150a is located closer to the reflective surface 212a than the first transparent electrode layer 150 is, and the second active layer 140a is located closer to the reflective surface 212a than the first active layer 140 is. The difference between this embodiment and the embodiment shown in FIG. 6 is that the operation method of the proximity sensor 100a further includes using the second light source 120a facing toward the bottom surface 114a of the second substrate 110a to emit second light L2 such that the second light L2 through the second gaps d2 of the second finger electrode 130a sequentially passes through the second active layer 140a and the second transparent electrode layer 150a; using the reflective surface 212a to reflect the second light L2 to form second reflected light L2R; and using the second active layer 140a to receive the second reflected light L2R that passes through the second transparent electrode layer 150a, thereby obtaining a second photocurrent value.

Since the proximity sensor 100a acts as two proximity sensors 100 of FIG. 1 having the height difference H, the proximity sensor 100a can detect the photocurrents of the first and second reflected lights L1R and L2R art the same time, in which the first and second reflected lights L1R and L2R are reflected by the reflective surface 212a. As a result, the first photocurrent value and the second photocurrent value different from the first photocurrent value can be obtained. When a distance between the reflective surface 212a and the proximity sensor 100a is changed, by using the height difference H and reading the change of the difference between the first and second photocurrent values, the reflection property of the reflective surface 212a may be further determined, thereby facilitating more precise distance discrimination.

Figure 11:
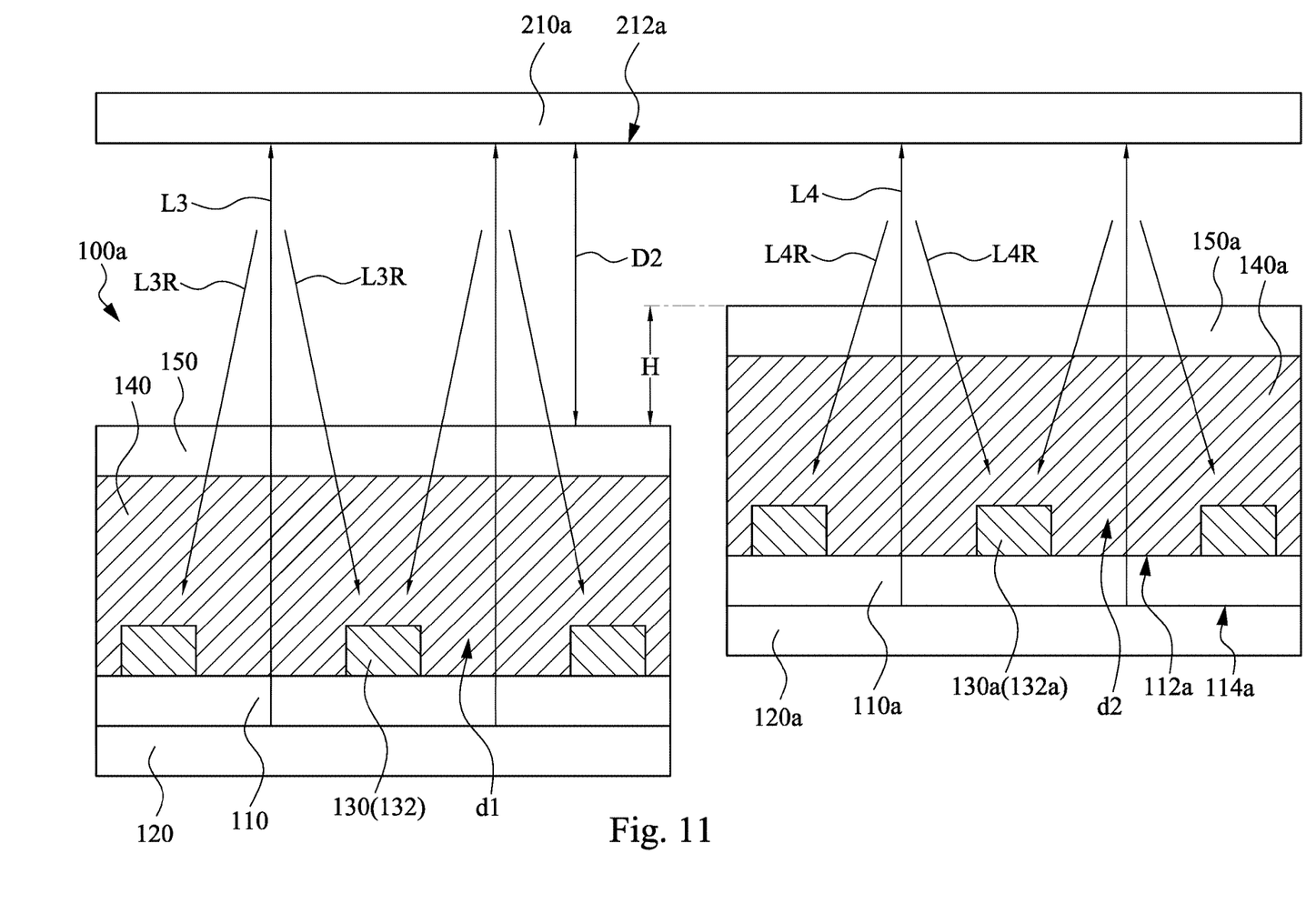
FIG. 11 is a cross-sectional view of the proximity sensor and a reflective surface of FIG. 10 after a distance therebetween is changed.

FIG. 11 is a cross-sectional view of the proximity sensor 100a and the reflective surface 212a of FIG. 10 after a distance therebetween is changed. A distance D1 (see FIG. 10) between the proximity sensor 100a and the reflective surface 212a is changed to a distance D2, but the height difference H of FIG. 11 is the same as the height difference H of FIG. 10. The operation method of the proximity sensor 100a further includes changing a distance between the reflective surface 212a and the proximity sensor 100a, such as the change from the distance D1 to the distance D2, to obtain a distance difference; respectively using the first light source 120 and the second light source 120a to emit third light L3 and fourth light L4; respectively using the first active layer 140 and the second active layer 140a to receive third reflected light L3R that passes through the first transparent electrode layer 150 and fourth reflected light L4R that passes through the second transparent electrode layer 150a, there by obtaining a third photocurrent value and a fourth photocurrent value; and determining a type of the reflective surface 212a (e.g., material and reflectivity) based on a first difference between the first photocurrent value and the second photocurrent value, a second difference between the third photocurrent value and the fourth photocurrent value, and the distance difference. In this embodiment, photocurrent measurement is performed when the distance between the reflective surface 212a and the proximity sensor 100a is changed. Through analyzing the change of the difference between the photocurrent values, the type of the reflective surface 212a can be determined, thereby precisely determining the distance between the proximity sensor 100a and the reflective surface 212a. The proximity sensor 100a can be used in an application requiring precise proximal sensing, such as an application in which robot fingers clamp an egg without breaking the egg.

Figure 12:
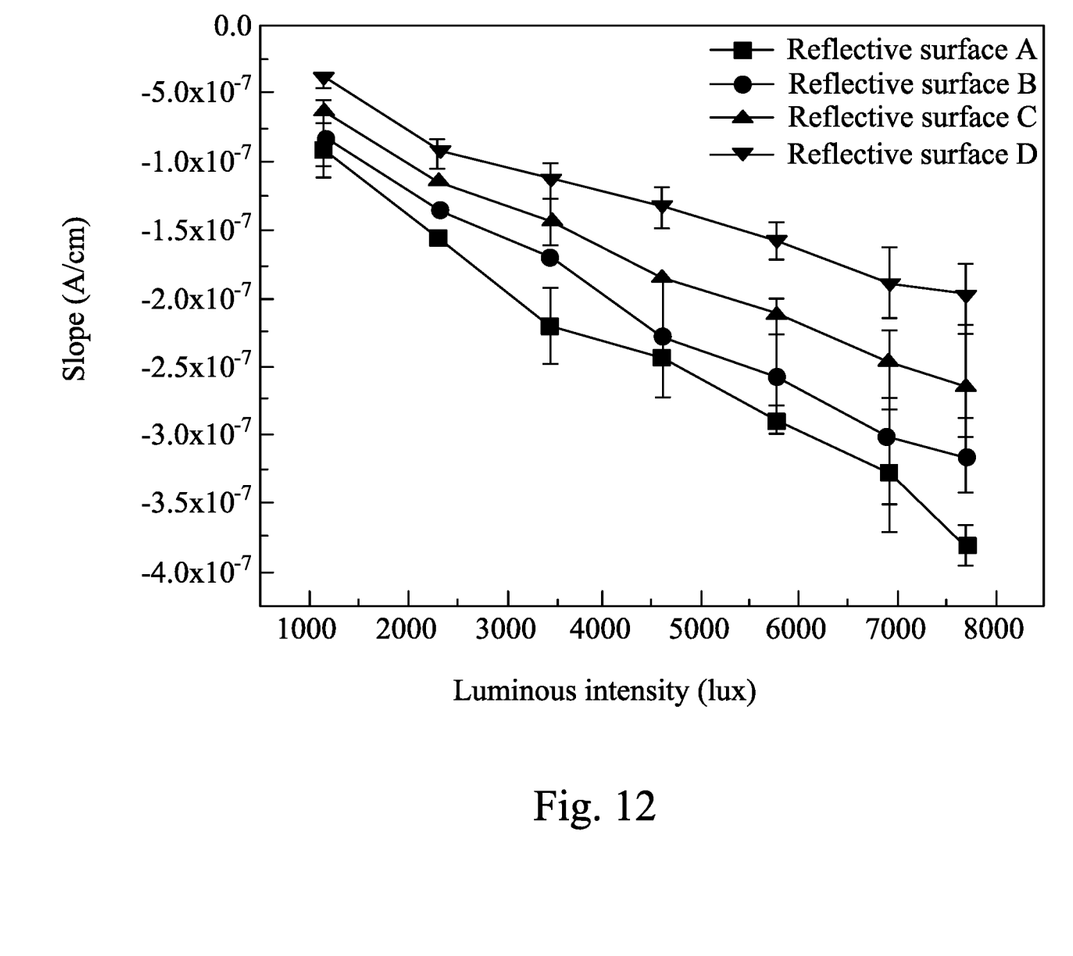
FIG. 12 illustrates relationships between slopes of photocurrents to distances and luminous intensities for a proximity sensor applied to an unknown reflective surface according to one embodiment of the present invention.

FIG. 12 illustrates relationships between slopes of photocurrents to distances and luminous intensities for the proximity sensor 100a applied to the unknown reflective surface 212a (see FIGS. 10 and 11) according to one embodiment of the present invention. Due to different types of reflective surfaces, the reflective surfaces may have different reflectivity to the same light source. When a distance between the reflective surface 212a and the proximity sensor 100a is changed, a luminous intensity change is different, such that the proximity sensor 100a that has the fixed height difference H and is located at the fixed distance D1 apart from the reflective surface 212a can obtain two different photocurrents (e.g., the aforementioned first and second photocurrents). Moreover, by moving the reflective surface 212a (or the proximity sensor 100a) to analyze the change of the difference between the two photocurrents, or the change of slopes of the high difference H to the difference between the photocurrents, the type of the reflective surface 212a (e.g., the value of reflectivity) can be determined. As shown in FIG. 12, when the distance of between the reflective surface 212a and the proximity sensor 100a is adjusted, if the reflectivity of the reflective surface 212a is lower, the change of the difference value between the photocurrents is smaller; if the reflectivity of the reflective surface 212a is higher, the change of the difference value between the photocurrents is obvious. In other words, the proximity sensor 100a functions to distinguish the reflective surface 212a. If the type of the reflective surface 212a can be determined as the type of a reflective surface A, B, C, or D, more precise distance discrimination may be advantageously achieved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A proximity sensor, comprising:
   a first substrate having a top surface and a bottom surface opposite the top surface;
   a first light source facing toward the bottom surface of the first substrate;
   a first finger electrode located on the top surface of the first substrate, and having a plurality of first finger portions and a plurality of first gaps between every two adjacent ones of the first finger portions;
   a first active layer covering the first finger electrode and located in the first gaps; and
   a first transparent electrode layer located on the first active layer, wherein when the first light source emits first light, the first light through the first gaps sequentially passes through the first active layer and the first transparent electrode layer onto a reflective surface, and the first light is reflected by the reflective surface to form first reflected light, and the first reflected light passes through the first transparent electrode layer and is received by the first active layer.

2. The proximity sensor of claim 1, wherein the first active layer overlaps with the first light source.

3. The proximity sensor of claim 1, wherein the first finger electrode is opaque.

4. The proximity sensor of claim 1, wherein first transparent electrode layer is made of a material comprising silver and aluminum.

5. The proximity sensor of claim 1, further comprising:
a second substrate spaced apart from the first substrate, and having a top surface and a bottom surface opposite the top surface;
a second light source facing toward the bottom surface of the second substrate;
a second finger electrode located on the top surface of the second substrate, and having a plurality of second finger portions and a plurality of second gaps between every two adjacent ones of the second finger portions;
a second active layer covering the second finger electrode and located in the second gaps; and
a second transparent electrode layer located on the second active layer, wherein when the second light source emits second light, the second light through the second gaps sequentially passes through the second active layer and the second transparent electrode layer onto the reflective surface, and the second light is reflected by the reflective surface to form second reflected light, and the second reflected light passes through the second transparent electrode layer and is received by the second active layer.

6. The proximity sensor of claim 5, wherein the second transparent electrode layer is located closer to the reflective surface than the first transparent electrode layer is.

7. The proximity sensor of claim 5, wherein the second active layer is located closer to the reflective surface than the first active layer is.

8. The proximity sensor of claim 5, wherein a luminous intensity of the first light source is substantially the same as that of the second light source, and a height difference is formed between the first transparent electrode layer and the second transparent electrode layer.

9. The proximity sensor of claim 5, wherein the second active layer overlaps with the second light source.

10. The proximity sensor of claim 5, wherein the second finger electrode is opaque.

11. The proximity sensor of claim 5, wherein the second transparent electrode layer is made of a material comprising silver and aluminum.

12. An operation method of a proximity sensor, the operation method comprising:
using a first light source facing toward a bottom surface of a first substrate to emit first light such that the first light through a plurality of first gaps of a first finger electrode sequentially passes through a first active layer and a first transparent electrode that is on the first active layer, the first active layer covering the first finger electrode;
using a reflective surface to reflect the first light to form first reflected light; and
using the first active layer to receive the first reflected light that passes through the first transparent electrode layer, thereby obtaining a first photocurrent value.

13. The operation method of claim 12, further comprising:
looking up a relationship between photocurrent and luminous intensity based on the first photocurrent value to obtain a distance between the reflective surface and the first active layer.

14. The operation method of claim 12, further comprising:
using a second light source facing toward a bottom surface of a second substrate to emit second light such that the second light through a plurality of second gaps of a second finger electrode sequentially passes through a second active layer and a second transparent electrode layer that is on the second active layer, the second active layer covering the second finger electrode, wherein a luminous intensity of the first light source is substantially the same as that of the second light source, and the second active layer is located closer to the reflective surface than the first active layer is;
using a reflective surface to reflect the second light to form second reflected light; and
using the second active layer to receive the second reflected light that passes through the second transparent electrode layer, thereby obtaining a second photocurrent value.

15. The operation method of claim 14, further comprising:
changing a distance between the reflective surface and the proximity sensor to obtain a distance difference;
respectively using the first light source and the second light source to emit third light and fourth light;
respectively using the first active layer and the second active layer to receive third reflected light that passes through the first transparent electrode layer and fourth reflected light that passes through the second transparent electrode layer, thereby obtaining a third photocurrent value and a fourth photocurrent value; and
determining a type of the reflective surface based on a first difference between the first photocurrent value and the second photocurrent value, a second difference between the third photocurrent value and the fourth photocurrent value, and the distance difference.

16. The operation method of claim 14, wherein a height difference is formed between the first transparent electrode layer and the second transparent electrode layer, the operation method further comprising:
determining a type of the reflective surface based on a difference between the first photocurrent value and the second photocurrent value and the height difference.

* * * * *